(12) United States Patent
Dasgupta et al.

(10) Patent No.: US 12,332,480 B2
(45) Date of Patent: Jun. 17, 2025

(54) IDENTIFICATION SYSTEM

(71) Applicant: GlobalFoundries U.S. Inc., Malta, NY (US)

(72) Inventors: Arpan Dasgupta, Beacon, NY (US); Norman W. Robson, Hopewell Junction, NY (US); Danny Moy, Bethel, CT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 108 days.

(21) Appl. No.: 18/076,265

(22) Filed: Dec. 6, 2022

(65) Prior Publication Data

US 2024/0184045 A1   Jun. 6, 2024

(51) Int. Cl.
| | |
|---|---|
| *G02B 6/12* | (2006.01) |
| *B23K 26/352* | (2014.01) |
| *G02B 6/124* | (2006.01) |
| *G02B 6/125* | (2006.01) |
| *H01L 23/544* | (2006.01) |
| *B41M 5/24* | (2006.01) |

(52) U.S. Cl.
CPC ............ *G02B 6/124* (2013.01); *B23K 26/352* (2015.10); *G02B 6/125* (2013.01); *H01L 23/544* (2013.01); *B41M 5/24* (2013.01); *G02B 6/12009* (2013.01); *H01L 2223/544* (2013.01)

(58) Field of Classification Search
CPC ..... H01L 23/544; H01L 23/57; B23K 26/352; B23K 26/354; B23K 26/355; B23K 26/356; B23K 26/3584; B41M 5/24; B41M 5/26; B41M 5/262; B41M 5/36; B41M 5/362; B44C 1/228; G02B 6/12; G02B 6/124; G02B 6/13; G02B 6/29
See application file for complete search history.

(56) References Cited

U.S. PATENT DOCUMENTS

| 3,728,521 A * | 4/1973 | Borough .................. G02B 6/43 |
| | | 235/487 |
| 4,323,755 A * | 4/1982 | Nierenberg ............... B44B 7/00 |
| | | 219/121.75 |

(Continued)

FOREIGN PATENT DOCUMENTS

| DE | 102013219591 A1 * | 4/2015 |
| EP | 3933469 A1 * | 1/2022 |

(Continued)

OTHER PUBLICATIONS

F. Tarik et al. Robust optical physical unclonable function using disordered photonic integrated circuits. Nanophotonics, 9:9:2817-2828, Jul. 3, 2020 (https://doi.org/10.1515/nanoph-2020-0049) (Year: 2020).*
H. Goldstein. The secret art of chip graffiti. IEEE Spectrum, 39:3:50-55, Mar. 2002 (https://doi.org/10.1109/6.988705) (Year: 2002).*
Florida State University, Molecular Expressions Silicon Zoo index page, last modified Nov. 13, 2015, 7 pages (https://micro.magnet.fsu.edu/creatures/index.html) (Year: 2015).*
B. Grubel et al. Silicon photonic physical unclonable function. Optics Express, 25:11:12710-12721, May 29, 2017 (https://doi.org/10.1364/OE.25.012710) (Year: 2017).*

(Continued)

*Primary Examiner* — Michael Stahl
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to an identification system, method of manufacture and method of use. The structure includes at least one waveguide structure and at least one damaged region positioned in a unique pattern on the at least one waveguide structure.

18 Claims, 3 Drawing Sheets

(56) References Cited

U.S. PATENT DOCUMENTS

| | | | |
|---|---|---|---|
| 4,522,656 A * | 6/1985 | Kuhn-Kuhnenfeld | ........................ H01L 21/268 257/E23.179 |
| 5,195,163 A * | 3/1993 | Burns | .................... G02B 6/122 216/65 |
| 5,218,594 A * | 6/1993 | Tanno | ..................... G11B 7/24 369/111 |
| 5,329,090 A * | 7/1994 | Woelki | ................. B23K 26/082 219/121.68 |
| 6,021,248 A * | 2/2000 | Cornish | ................. G02B 6/122 385/147 |
| 8,404,133 B2 * | 3/2013 | Sakuma | ................. G02B 6/124 430/311 |
| 8,742,599 B2 | 6/2014 | Rampley et al. | |
| 9,086,387 B2 | 7/2015 | Assefa et al. | |
| 9,449,201 B2 | 9/2016 | Moran et al. | |
| 11,409,040 B1 * | 8/2022 | Bian | ..................... G02B 6/1228 |
| 2001/0010333 A1 * | 8/2001 | Han | ..................... G11B 23/281 |
| 2006/0233504 A1 * | 10/2006 | Hochberg | .............. B82Y 20/00 385/129 |
| 2010/0314750 A1 * | 12/2010 | Bhate | .................... H01L 23/544 257/730 |
| 2011/0274393 A1 * | 11/2011 | Reed | ....................... G02B 6/124 427/523 |
| 2013/0146478 A1 * | 6/2013 | Iyengar | ............ G01N 33/48707 204/407 |
| 2013/0208358 A1 * | 8/2013 | Psaila | ................. G02B 6/12002 359/566 |
| 2014/0010498 A1 * | 1/2014 | Verslegers | ............... G02B 6/26 385/37 |
| 2015/0016778 A1 * | 1/2015 | Wach | ................... G02B 6/3652 385/55 |
| 2016/0103065 A1 * | 4/2016 | Lee | ...................... G02B 6/0043 385/38 |
| 2017/0146738 A1 * | 5/2017 | Xu | .......................... G02B 6/107 |
| 2017/0243831 A1 * | 8/2017 | Butler | .................. H01L 23/544 |
| 2017/0276874 A1 * | 9/2017 | Kashyap | ............ B23K 26/0006 |
| 2017/0345717 A1 * | 11/2017 | Kaspar | ................. H01L 23/544 |
| 2018/0025182 A1 * | 1/2018 | Geis | ..................... G02B 6/4214 713/189 |
| 2019/0156066 A1 * | 5/2019 | Foster | .................... G06F 21/72 |
| 2022/0069990 A1 * | 3/2022 | Ryckman | .................. G01B 1/00 |
| 2022/0083755 A1 * | 3/2022 | Srinivasan | ............. G06K 1/126 |
| 2022/0283372 A1 * | 9/2022 | Albrechtsen | ............. G02B 6/14 |

FOREIGN PATENT DOCUMENTS

| | | | |
|---|---|---|---|
| JP | 11-135390 A * | 5/1999 | |
| WO | WO 2023/061706 A1 * | 4/2023 | |

OTHER PUBLICATIONS

M. Liao et al. On-chip silicon optical scattering physical unclonable function towards hardware security. Journal of Lightwave Technology, 41:5:1487-1494, Mar. 1, 2023 (https://doi.org/10.1109/JLT.2022.3221186) (Year: 2023).*

D. Bachman et al. Femtosecond laser tuning of silicon microring resonators. Optics Letters, 36:23:4695-4697, Dec. 1, 2011 (https://doi.org/10.1364/OL.36.004695) (Year: 2011).*

Extended European search report for application EP 23199265, dated Mar. 22, 2024 (Year: 2024).*

Yusheng Bian et al., "Towards low-loss monolithic silicon and nitride photonic building blocks in state-of-the-art 300mm CMOS foundry", OSA frontiers in optics & laser science APS/DLS, FW5D.2, Sep. 14-17, 2020, 2 pages.

Ken Giewont et al., "300-mm Monolithic Silicon Photonics Foundry Technology", in IEEE Journal of Selected Topics in Quantum Electronics, vol. 25, No. 5, pp. 1-11, Sep.-Oct. 2019, Art No. 8200611, doi: 10.1109/JSTQE.2019.2908790. https://ieeexplore.ieee.org/document/8678809, 12 pages.

Bo Peng et al., "A CMOS Compatible Monolithic Fiber Attach Solution with Reliable Performance and Self-alignment", in Optical Fiber Communication Conference (OFC) 2020, OSA Technical Digest (Optica Publishing Group, 2020), paper Th3I.4, 3 pages.

Michal Rakowski et al., "45nm CMOS—Silicon Photonics Monolithic Technology (45CLO) for next-generation, low power and high speed optical interconnects", in Optical Fiber Communication Conference (OFC) 2020, OSA Technical Digest (Optica Publishing Group, 2020), paper T3H.3, 3 pages.

Yusheng Bian et al., "Monolithically integrated silicon nitride platform", in Optical Fiber Communication Conference (OFC) 2021, P. Dong, J. Kani, C. Xie, R. Casellas, C. Cole, and M. Li, eds., OSA Technical Digest (Optica Publishing Group, 2021), paper Th1A.46, 3 pages.

Abdelsalam Aboketaf et al., "Towards fully automated testing and characterization for photonic compact modeling on 300-mm wafer platform", in Optical Fiber Communication Conference (OFC) 2021, P. Dong, J. Kani, C. Xie, R. Casellas, C. Cole, and M. Li, eds., OSA Technical Digest (Optica Publishing Group, 2021), paper W6A. 1, 3 pages.

Yusheng Bian et al., "Hybrid III-V laser integration on a monolithic silicon photonic platform", in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2, 3 pages.

Y C Lam et al., "Seeing the invisible laser markings", 2009 J. Phys. D: Appl. Phys. 42 042004, https://iopscience.iop.org/article/10.1088/0022-3727/42/4/042004, 5 pages.

* cited by examiner

IDENTIFICATION SYSTEM

BACKGROUND

The present disclosure relates to semiconductor structures and, more particularly, to an identification system, method of manufacture and method of use for identifying photonics chips.

Chip identification can be performed through electrical fuses. With the use of the electrical fuses, probing the chips can be performed electrically, which returns a binary code corresponding to a given wafer and position on the wafer.

Many silicon photonics chips, though, do not have electrical probing functionalities. Accordingly, there is no existing tracking methods on the dies once these dies are diced up from the wafer. And without any probing, these chips cannot be identified.

SUMMARY

In an aspect of the disclosure, a structure comprises: at least one waveguide structure and at least one damaged region positioned in a unique pattern on the at least one waveguide structure.

In an aspect of the disclosure, a structure comprises: a grating coupler; at least one waveguide structure optically coupled to the grating coupler, the at least one waveguide structure comprising a spine, posts, and a scattering site at a transition of the spine and the posts; and at least one damaged region positioned in a unique pattern on the at least one waveguide structure.

In an aspect of the disclosure, a method comprises damaging at least one waveguide structure with a unique pattern for a given photonics chip.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an identification system, method of manufacture and method of use for identifying photonics chips. More specifically, the present disclosure relates to an infrared identification system for bare dies, method of manufacture and method of use. In embodiments, a chip identification (ID) may be encoded on optical bare dies (e.g., photonics chips) that have no electrical probing capabilities. Advantageously, by implementing the aspects of the present disclosure it is now possible to enable tracking of bare dies after dicing.

In embodiments, a photonics structure (e.g., grating coupler) may include damaged regions not visible in optical light. The damaged regions, though, may be visible in non-visible light (e.g., infrared). The damaged regions may be formed in unique patterns for a given wafer/chip so that it can be used as an identification system for photonics chips. The damaged portions may be provided by an external laser to selectively induce scattering spots in the device, which are later used to identify the photonics chip. The damage may be read by an infrared camera coupled to a decoding system. In this way, a chip ID may be encoded on photonics chips that have no electrical probing capabilities.

The photonics structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
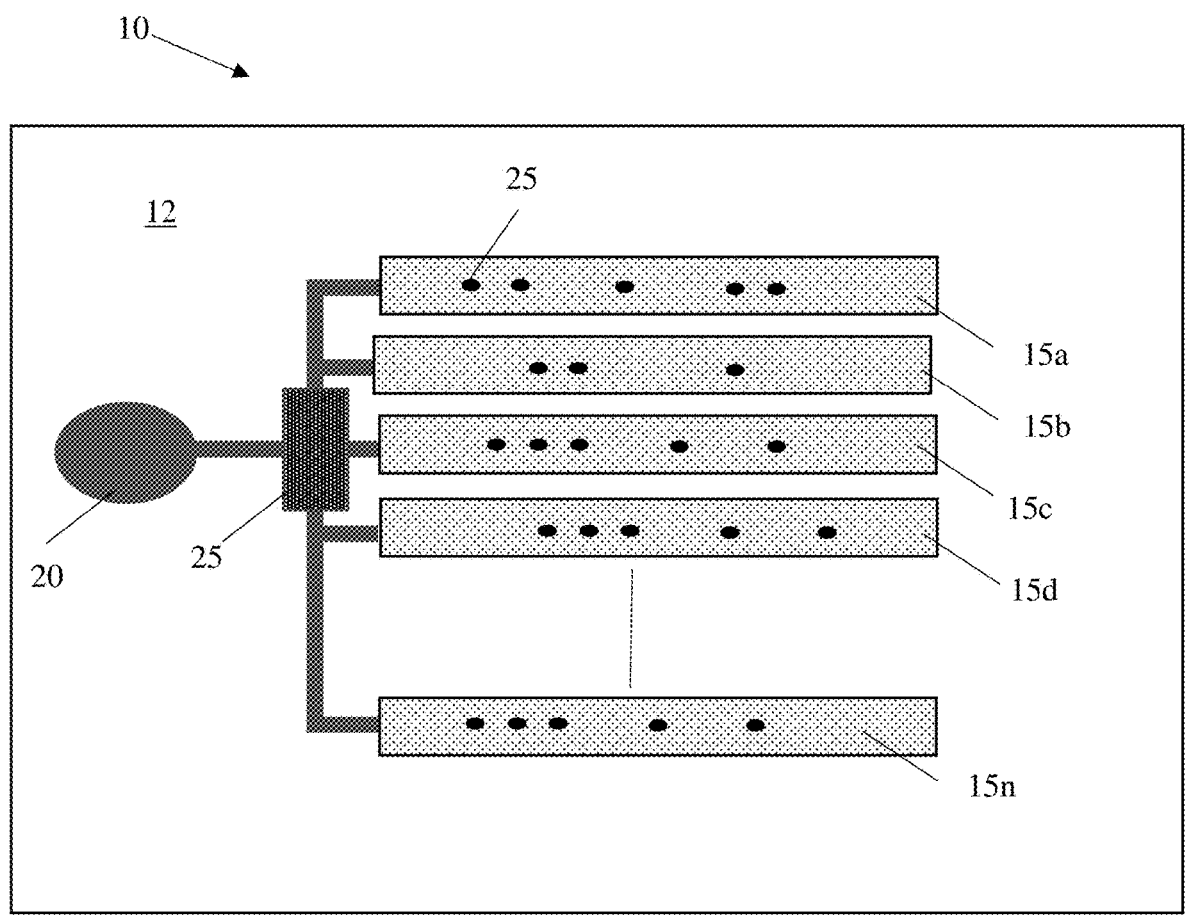
FIG. 1 shows a structure with damaged portions in accordance with aspects of the present disclosure.

FIG. 1 shows a structure with damaged portions in accordance with aspects of the present disclosure. More specifically, a photonics structure 10 includes a chip 12 with a grating coupler 20 split into a plurality of waveguide structures 15a, 15b, 15c, 15d . . . 15n using a splitter 25 as is known in the art. In embodiments, any number of back-to-back spot size converters, e.g., waveguide structures, are contemplated by the present disclosure. For example, the grating coupler 20 may be split from 1 to n waveguide structures and, more preferably 1 to 8 waveguide structures. The waveguide structures 15a, 15b, 15c, 15d . . . 15n may be embedded with insulator material, e.g., buried oxide, $SiO_2$, thermal oxide, TEOS, etc., as represented by reference numeral 12.

As further shown in FIG. 1, each of the waveguide structures 15a, 15b, 15c, 15d . . . 15n may include one or more damaged regions 25. The damage regions 25 may be provided in unique patterns for a given wafer/chip so that it can be used as an identification system for photonics chips, as an example. The damaged regions 25 may be scattering sites (spots) which are too small to be visible in optical microscopes; instead, in preferred embodiments, the damaged regions 25 are visible in non-visible light (e.g., infrared spectrum).

FIGS. 2A-2D show different configurations of the waveguide structures 15 that may be implemented in any of the embodiments described herein. It should be understood by those of skill in the art that the waveguide structures 15 may be composed of patterned Si. For example, the waveguide structures 15 may be composed of SiN or other dielectric materials, e.g., nitrogen-doped silicon carbide (SiCN), $SiO_2$, doped $SiO_2$, $Si_3N_4$ (SiN), Si, SiON, $Al_2O_3$, AlN, diamond, etc. Also, the waveguide structures 15 may be applicable to solid and metamaterial edge couplers, and may include offsets along the longitudinal direction.

Figure 2A:
FIGS. 2A-2D show different configurations of a waveguide structure that may be implemented in any of the aspects of the present disclosure.
Figure 2B:
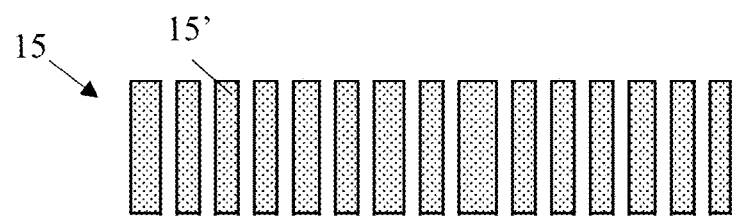
Figure 2C:
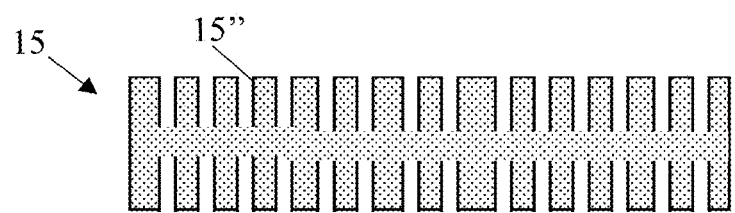
Figure 2D:
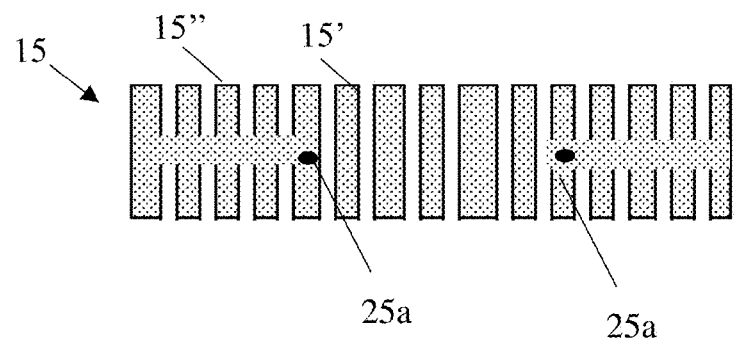

For example, the waveguide structure 15 may include a taper as shown in FIG. 2A or a straight configuration as shown in FIG. 1. As shown in FIG. 2B, the waveguide structure 15 may include stripes or posts 15' (at a taper portion or straight portion). In FIG. 2C, the waveguide structure 15 may include partial stripes 15" (which include a spine); whereas, in FIG. 2D, the waveguide structure 15 may include a combination of stripes 15' with partial stripes 15" at the end portions. In embodiments, and as should be understood by one of skill in the art, the stripes 15' and the partial stripes 15" may be fully or partially etched features, respectively, of SiN (or other material described herein) of the waveguide structure 15. Moreover, in the configuration of FIG. 2D, two known scattering sites 25a may be mandated by design. For example, the known scattering sites 25a may be a product of a post to spine transition.

Figure 3:
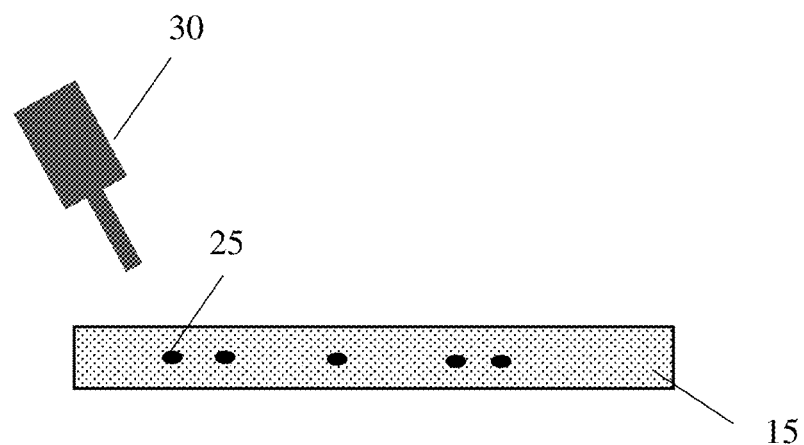
FIG. 3 shows a method of manufacturing the structure shown in FIG. 1.

FIG. 3 shows a method of manufacturing the structure shown in FIG. 1. In particular, an external laser 30 may be programmed to melt selective areas in the waveguide structure 15 resulting in the damaged regions 25. In embodiments, the damaged regions 25 may act as light scattering sites, e.g., scatter incident light, which will encode a wafer ID and the position of the chip within the wafer, as examples.

The external laser 30 may be provided in different wavelengths depending on the material of the waveguide structure 15. For example, a particular wavelength of the external laser 30 may be used based on the absorption spectrum of the material of the waveguide structure 15 and which wavelength would damage such material. In embodiments, the external laser 30 may be provided in a green wavelength, e.g., about 550 nm.

Figure 4:
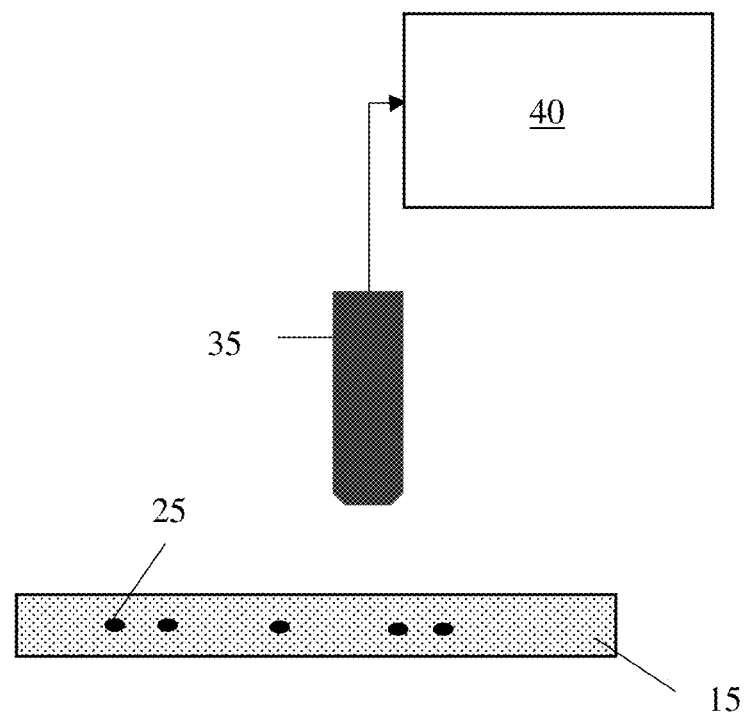
FIG. 4 shows a system and method of decoding the identification of the structure shown in FIG. 1.

FIG. 4 shows a system and method of decoding the identification of the structure 10 shown in FIG. 1. As shown in the system of FIG. 4, a camera 35 may be used to scan the waveguide structure 15 for damaged regions 25. In embodiments, the camera 35 is an infrared camera that can pick up the damaged regions 25, e.g., scattering sites, introduced by the external laser shown in FIG. 3.

The images taken by the camera 35 may be fed into a decoder 40. The decoder 40 may then decode the positions of the damaged regions 25 and reconcile such with a known pattern configuration for a specific chip to identify the chip. In this way, the position of the damaged regions 25 can be read by the camera 35 to be decoded by the decoder 40 in order to identify a photonics chip (e.g., the wafer and chip position) with no external electrical connections. In embodiments, the decoder 40 may be a 1D barcode system when the grating coupler 20 is not split into multiple waveguide structures 15. Alternatively, the decoder 40 may be a 2D data matrix system when the grating coupler 20 is split into multiple waveguide structures 15.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising at least one waveguide structure and at least one damaged region positioned in a unique pattern on the at least one waveguide structure and which comprise scattering spots visible in non-visible light to identify a photonics chip, wherein the at least one waveguide structure comprises multiple waveguide structures split from a grating coupler.

2. The structure of claim 1, wherein the at least one damaged region is not visible in optical light.

3. The structure of claim 1, wherein the at least one damaged region is visible in an infrared spectrum.

4. The structure of claim 1, wherein the at least one damaged region comprises multiple damaged regions in the unique pattern on the at least one waveguide structure.

5. The structure of claim 1, wherein the at least one damaged region comprises multiple damaged regions in the unique pattern on the multiple waveguide structures.

6. A structure comprising at least one waveguide structure and at least one damaged region positioned in a unique pattern on the at least one waveguide structure and which comprise scattering spots visible in non-visible light to identify a photonics chip, wherein the at least one waveguide structure comprises a spine.

7. The structure of claim 6, wherein the at least one waveguide structure comprises posts transitioning from the spine.

8. The structure of claim 7, further comprising light scattering sites at a transition between the posts and the spine.

9. The structure of claim 1, wherein the at least one waveguide structure comprises Si material.

10. A structure comprising:
   a grating coupler;
   at least one waveguide structure optically coupled to the grating coupler, the at least one waveguide structure comprising a spine, posts, and a light scattering site at a transition of the spine and the posts; and
   at least one damaged region positioned in a unique pattern on the at least one waveguide structure.

11. The structure of claim 10, wherein the at least one damaged region is not visible in optical light.

12. The structure of claim 10, wherein the at least one damaged region is visible in an infrared spectrum.

13. The structure of claim 10, wherein the at least one damaged region comprises multiple light scattering sites in the unique pattern.

14. The structure of claim 10, wherein the at least one damaged region comprises a melted portion of Si material.

15. A method comprising damaging at least one waveguide structure with a unique pattern for a given photonics chip and identifying the given photonics chip by scanning the unique pattern with an infrared camera and decoding an image of the unique pattern with a decoder, wherein the damaging comprises melting specific locations on multiple waveguide structures on the given photonics chip.

16. The method of claim 15, wherein the damaging is provided by an external laser.

17. The method of claim 16, wherein the damaging forms a light scattering site visible in an infrared spectrum.

18. A structure comprising at least one waveguide structure and at least one damaged region positioned in a unique pattern on the at least one waveguide structure and which comprise scattering spots visible in non-visible light to identify a photonics chip, wherein the at least one waveguide structure comprises multiple waveguide structures split from a grating coupler and the at least one damaged region comprises multiple damaged regions comprising scattering sites not visible in optical light and which forms a unique pattern for a given chip or wafer.

* * * * *